United States Patent
Pelzer et al.

(10) Patent No.: US 11,031,321 B2
(45) Date of Patent: Jun. 8, 2021

(54) SEMICONDUCTOR DEVICE HAVING A DIE PAD WITH A DAM-LIKE CONFIGURATION

(71) Applicant: Infineon Technologies AG, Neubiberg (DE)

(72) Inventors: Rainer Pelzer, Wernberg (AT); Fortunato Lopez, Unterhaching (DE); Antonia Maglangit, Villach (AT); Siti Amira Faisha Shikh Zakaria, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 9 days.

(21) Appl. No.: 16/354,392

(22) Filed: Mar. 15, 2019

(65) Prior Publication Data
US 2020/0294894 A1  Sep. 17, 2020

(51) Int. Cl.
| | |
|---|---|
| H01L 23/495 | (2006.01) |
| H01L 21/768 | (2006.01) |
| H01L 21/48 | (2006.01) |
| H01L 23/532 | (2006.01) |

(52) U.S. Cl.
CPC .... *H01L 23/49513* (2013.01); *H01L 21/4821* (2013.01); *H01L 21/76876* (2013.01); *H01L 23/49562* (2013.01); *H01L 23/53238* (2013.01)

(58) Field of Classification Search
CPC ......................... H01L 23/49513; H01L 21/482
USPC ........................................................ 257/666
See application file for complete search history.

(56) References Cited

U.S. PATENT DOCUMENTS

| | | | |
|---|---|---|---|
| 4,988,423 A | 1/1991 | Yamamoto et al. | |
| 5,578,522 A | 11/1996 | Nakamura et al. | |
| 6,020,640 A | 2/2000 | Efland et al. | |
| 6,362,525 B1 * | 3/2002 | Rahim | H01L 23/49838 |
| | | | 257/528 |

(Continued)

FOREIGN PATENT DOCUMENTS

| | | |
|---|---|---|
| DE | 102004059389 A1 | 6/2006 |
| DE | 102006052202 B3 | 2/2008 |

(Continued)

OTHER PUBLICATIONS

Joshi, Ravi, et al., "Power Metallization Structure for Semiconductor Devices", U.S. Appl. No. 16/048,667, filed Jul. 30, 2018.

*Primary Examiner* — Jami Valentine Miller
(74) *Attorney, Agent, or Firm* — Murphy, Bilak & Homiller, PLLC

(57) ABSTRACT

A semiconductor device includes a semiconductor substrate, a power transistor formed in the semiconductor substrate, the power transistor including an active area in which one or more power transistor cells are formed, a first metal pad formed above the semiconductor substrate and covering substantially all of the active area of the power transistor, the first metal pad being electrically connected to a source or emitter region in the active area of the power transistor, the first metal pad including an interior region laterally surrounded by a peripheral region, the peripheral region being thicker than the interior region, and a first interconnect plate or a semiconductor die attached to the interior region of the first metal pad by a die attach material. Corresponding methods of manufacture are also described.

20 Claims, 16 Drawing Sheets

(56) References Cited

U.S. PATENT DOCUMENTS

| | | |
|---|---|---|
| 6,544,880 B1 | 4/2003 | Akram |
| 6,576,539 B1 | 6/2003 | Lin |
| 7,071,537 B2 | 7/2006 | Kelberlau et al. |
| 7,122,902 B2 | 10/2006 | Hatano et al. |
| 9,196,560 B2 | 11/2015 | Roth et al. |
| 9,397,022 B2 | 7/2016 | Roth et al. |
| 9,831,206 B2 * | 11/2017 | Raravikar ............ B23K 35/025 |
| 10,304,782 B2 | 5/2019 | Mataln et al. |
| 2001/0036804 A1 | 11/2001 | Mueller et al. |
| 2002/0149118 A1 | 10/2002 | Yamaguchi et al. |
| 2002/0149958 A1 | 10/2002 | Kunikiyo |
| 2003/0183913 A1 | 10/2003 | Robl et al. |
| 2005/0179068 A1 | 8/2005 | Rueb et al. |
| 2005/0239277 A1 | 10/2005 | Mercer et al. |
| 2005/0258484 A1 | 11/2005 | Itou |
| 2007/0222087 A1 | 9/2007 | Lee et al. |
| 2007/0228543 A1 * | 10/2007 | Walter .................... H01L 24/11 257/686 |
| 2008/0001162 A1 | 1/2008 | Hackenberger et al. |
| 2008/0254600 A1 | 10/2008 | Liu et al. |
| 2010/0207237 A1 | 8/2010 | Yao et al. |
| 2010/0314725 A1 | 12/2010 | Gu et al. |
| 2012/0235278 A1 | 9/2012 | Shigihara et al. |
| 2013/0203214 A1 | 8/2013 | Isobe et al. |
| 2014/0061823 A1 | 3/2014 | Kam et al. |
| 2015/0115391 A1 | 4/2015 | Roth et al. |
| 2015/0348987 A1 | 12/2015 | Lee et al. |
| 2016/0268184 A1 | 9/2016 | Hirano et al. |
| 2017/0098620 A1 | 4/2017 | Roth et al. |
| 2018/0145045 A1 | 5/2018 | Zundel et al. |
| 2018/0350760 A1 | 12/2018 | Usami |

FOREIGN PATENT DOCUMENTS

| | | |
|---|---|---|
| DE | 102010061189 A1 | 6/2011 |
| DE | 102012109995 A1 | 4/2014 |
| DE | 102015219183 A1 | 4/2017 |
| DE | 102016122318 A1 | 5/2018 |
| JP | H01309340 A | 12/1989 |
| WO | 2016024946 A1 | 2/2016 |

* cited by examiner

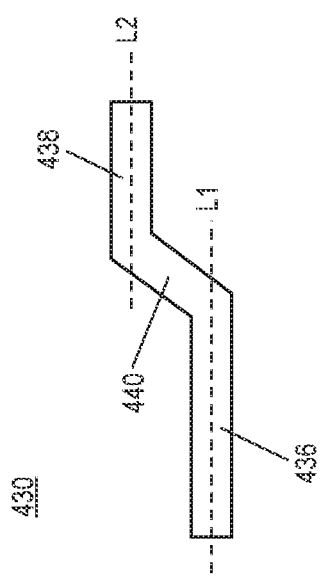
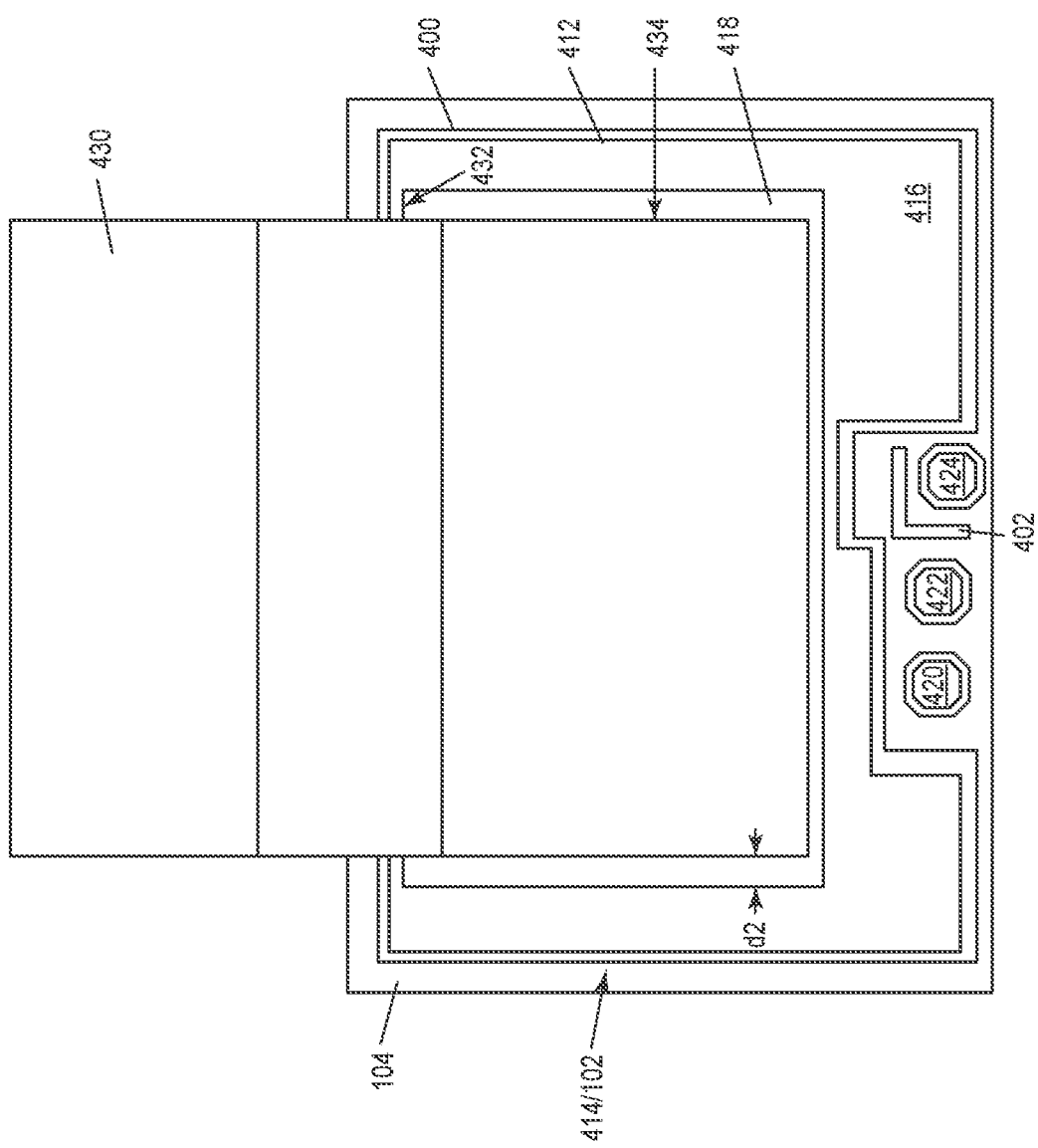

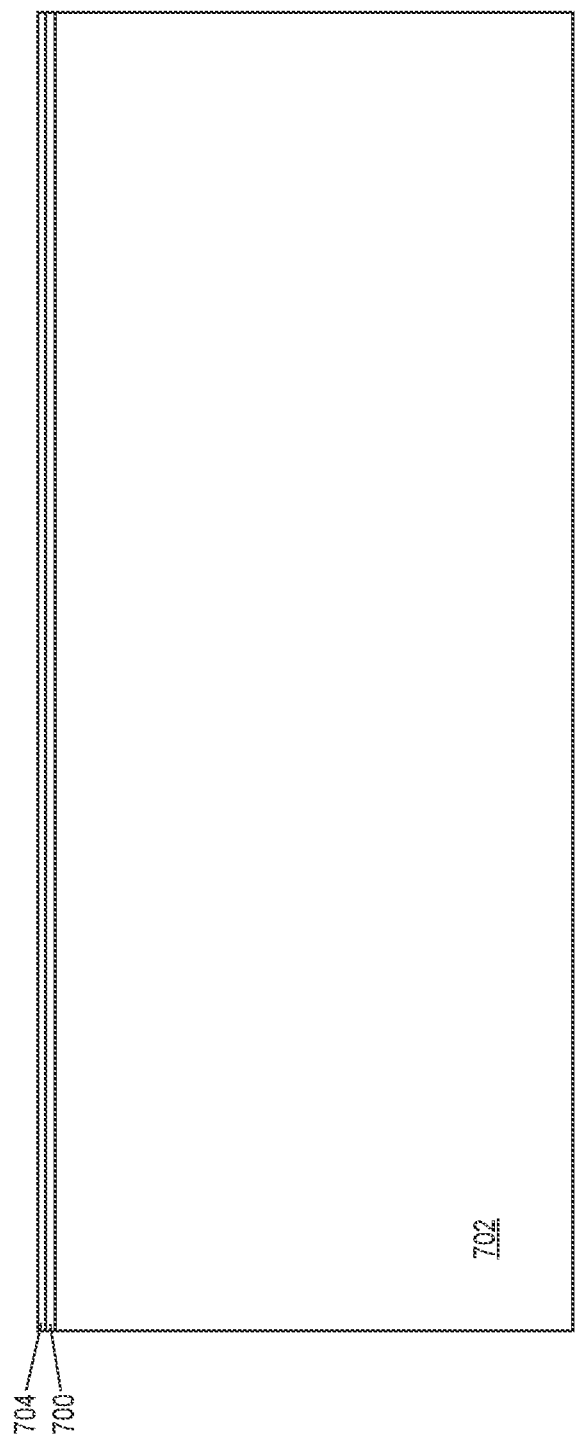

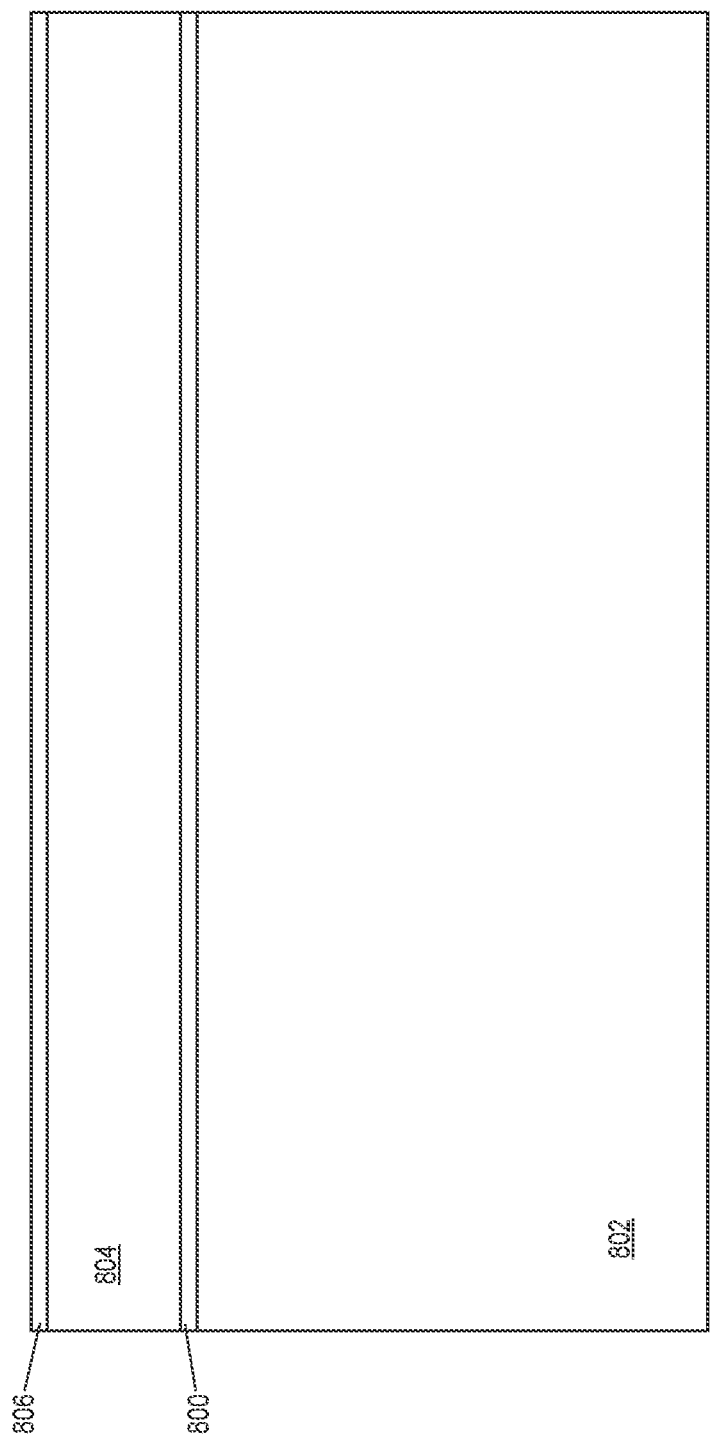

SEMICONDUCTOR DEVICE HAVING A DIE PAD WITH A DAM-LIKE CONFIGURATION

BACKGROUND

Many semiconductor device technologies use metal clips for source/emitter pad interconnections. Cross-contamination between neighboring bond pads is a concern with clip bonding, which utilizes solder paste materials. The undesired distribution or spreading of the solder paste material is typically referred to as 'flooding', and can lead to severe die pad corrosion. Cu-based logic die pads are particularly sensitive to solder paste material flooding. For example, typical Cu-to-Cu nail-head bonding processes do not allow any organic foreign material or corrosive byproducts on the Cu die pad surface.

Thus, there is a need for improved semiconductor device interconnect technology.

SUMMARY

According to an embodiment of a semiconductor device, the semiconductor device comprises: a semiconductor substrate; a power transistor formed in the semiconductor substrate, the power transistor including an active area in which one or more power transistor cells are formed; a first metal pad formed above the semiconductor substrate and covering substantially all of the active area of the power transistor, the first metal pad being electrically connected to a source or emitter region in the active area of the power transistor, the first metal pad comprising an interior region laterally surrounded by a peripheral region, the peripheral region being thicker than the interior region; and a first interconnect plate or a semiconductor die attached to the interior region of the first metal pad by a die attach material.

In one embodiment, the interior region of the first metal pad has a thickness in a range of 5 µm to 10 µm and the peripheral region of the first metal pad has a thickness of about 20 µm or greater.

Separately or in combination, the semiconductor substrate may have a thickness of 250 µm or less, e.g. 60 µm or less.

Separately or in combination, the peripheral region of the first metal pad may be thicker than the die attach material.

Separately or in combination, the die attach material may be thicker than the peripheral region of the first metal pad so that a bottom surface of the first interconnect plate or the semiconductor die is disposed above a top surface of the peripheral region of the first metal pad.

Separately or in combination, a bottom surface of the first interconnect plate may have one or more structures laterally disposed inward from the peripheral region of the first metal pad and vertically extending toward the interior region of the first metal pad.

Separately or in combination, the peripheral region of the first metal pad may be divided into a plurality of segments and neighboring ones of the segments may be laterally separated by a gap.

Separately or in combination, the power transistor may comprise a plurality of output channels, each output channel configured to deliver current to a load, the power transistor may comprise an individual active area for each output channel, and the first metal pad may cover substantially a first one of the active areas of the power transistor.

Separately or in combination, the semiconductor device may further comprise: a plurality of additional metal pads formed above the semiconductor substrate, each additional metal pad covering substantially a corresponding one the active areas of the power transistor, each additional metal pad being electrically connected to a source or emitter region in the active area substantially covered by the metal pad, each metal pad comprising an interior region laterally surrounded by a peripheral region, the peripheral region being thicker than the interior region; and a plurality of additional interconnect plates, each additional interconnect plate being attached to the interior region of a corresponding one of the additional metal pads by a die attach material.

Separately or in combination, the semiconductor device may further comprise one or more logic devices integrated in a different region of the semiconductor substrate as the power transistor.

Separately or in combination, the first metal pad may be a Cu pad and the first interconnect plate may be a Cu clip.

According to an embodiment of a method of manufacturing a semiconductor device, the method comprises: forming a power transistor in a semiconductor substrate, the power transistor including an active area in which one or more power transistor cells are formed; forming a first metal pad above the semiconductor substrate and which covers substantially all of the active area of the power transistor, the first metal pad being electrically connected to a source or emitter region in the active area of the power transistor, the first metal pad comprising an interior region laterally surrounded by a peripheral region, the peripheral region being thicker than the interior region; and attaching a first interconnect plate or a semiconductor die to the interior region of the first metal pad by a die attach material.

In one embodiment, forming the first metal pad comprises: depositing a first Cu layer above the semiconductor substrate and which covers substantially all of the active area of the power transistor; forming a mask on a part of the first Cu layer which corresponds to the interior region of the first metal pad, the mask configured to prevent Cu deposition; and depositing a second Cu layer on a part of the first Cu layer unprotected by the mask to form the peripheral region of the first metal pad, the interior region of the first metal pad being formed by the part of the first Cu layer protected by the mask during the depositing of the second Cu layer. The first Cu layer may have a thickness in a range of 5 µm to 10 µm and the second Cu layer may have a thickness in a range of 10 µm to 20 µm.

In another embodiment, forming the first metal pad may comprise: depositing a Cu layer above the semiconductor substrate and which covers substantially all of the active area of the power transistor; forming a mask on a part of the Cu layer which corresponds to the peripheral region of the first metal pad, the mask configured to prevent Cu etching; and etching a part of the Cu layer unprotected by the mask to form the interior region of the first metal pad, the peripheral region of the first metal pad being formed by the part of the Cu layer protected by the mask during the etching of the Cu layer. The thickness of the Cu layer as deposited may be about 20 µm or more and the thickness of the etched part of the Cu layer may be in a range of 5 µm to 10 µm.

Separately or in combination, the peripheral region of the first metal pad may be thicker than the die attach material and wherein attaching the first interconnect plate or the semiconductor die to the interior region of the first metal pad may comprise: depositing the die attach material on the interior region of the first metal pad; and placing the first interconnect plate in contact with the die attach material while using the peripheral region of the first metal pad to align the first interconnect plate with the first metal pad.

Separately or in combination, the die attach material may be thicker than the peripheral region of the first metal pad and wherein attaching the first interconnect plate or the semiconductor die to the interior region of the first metal pad may comprise: depositing the die attach material on the interior region of the first metal pad; and placing the first interconnect plate in contact with the die attach material while using surface tension of the die attach material to align the first interconnect plate with the first metal pad.

Separately or in combination, a bottom surface of the first interconnect plate may have one or more structures laterally disposed inward from the peripheral region of the first metal pad and attaching the first interconnect plate or the semiconductor die to the interior region of the first metal pad may comprise: depositing the die attach material on the interior region of the first metal pad; and placing the first interconnect plate in contact with the die attach material so that the one or more features at the bottom surface of the first interconnect plate vertically extend toward the interior region of the first metal pad and are laterally disposed inward from the peripheral region of the first metal pad, to align the first interconnect plate with the first metal pad.

Separately or in combination, the power transistor may comprise a plurality of output channels, each output channel configured to deliver current to a load, the power transistor may comprise an individual active area for each output channel, the first metal pad may cover substantially a first one of the active areas of the power transistor, and the method may further comprise: forming a plurality of additional metal pads above the semiconductor substrate, each additional metal pad covering substantially a corresponding one the active areas of the power transistor, each additional metal pad being electrically connected to a source or emitter region in the active area substantially covered by the Metal pad, each Metal pad comprising an interior region laterally surrounded by a peripheral region, the peripheral region being thicker than the interior region; and attaching each of a plurality of additional interconnect plates to the interior region of a corresponding one of the additional metal pads by a die attach material.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 3A through 3C illustrate respective top plan views of an embodiment of forming the metal pad 102 with the dam-like configuration shown in FIGS. 2A through 2B.

FIG. 4 illustrates a side perspective view of an embodiment of an interconnect plate attached to the thinner interior region of the first metal pad shown in FIGS. 3A through 3C.

FIGS. 9A through 9E illustrate respective sectional views during different stages of manufacturing a semiconductor device having one or more metal pads with a dam-like configuration.

FIGS. 10A through 10C illustrate respective sectional views during different stages of manufacturing a semiconductor device having one or more metal pads with a dam-like configuration, according to another embodiment.

DETAILED DESCRIPTION

The embodiments described herein provide a metal pad structure for a semiconductor die, and corresponding methods of manufacture. The metal pad has an interior region laterally surrounded by a peripheral region. The peripheral region is thicker than the interior region. The interior region of the metal pad is configured for attachment to an interconnect plate such as a metal clip or metal block, or for attachment to another semiconductor die. The thicker peripheral region of the metal pad forms a dam-like structure for retaining material used to attach the interconnect plate or the other semiconductor die to the metal pad. Also beneficially, the metal pad exerts less mechanical stress on the semiconductor substrate during heating and cooling of the device because the interior region of the metal pad is made thinner.

Figure 1:
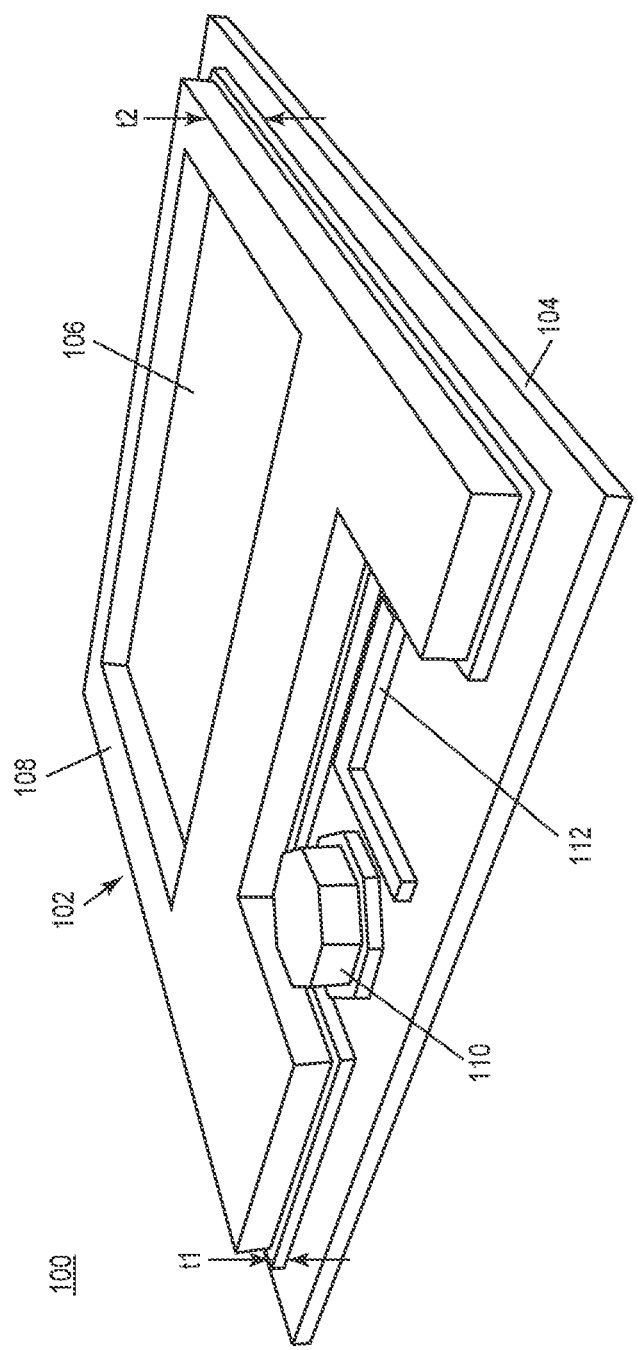
FIG. 1 illustrates a side perspective view of an embodiment of a semiconductor device having a metal pad with a dam-like configuration.

FIG. 1 illustrates a side perspective view of an embodiment of a semiconductor device 100 having a metal pad 102 with a dam-like configuration. According to this embodiment, the semiconductor device 100 includes a semiconductor substrate 104 and a power transistor such as a power MOSFET (metal-oxide-semiconductor field-effect transistor), IGBT (insulated gate bipolar transistor), HEMT (high-electron mobility transistor), etc. formed in the semiconductor substrate 104. One or more logic devices may be integrated in a different region of the semiconductor substrate 104 as the power transistor, e.g., for controlling the power transistor. For example, a driver circuit and/or controller may be integrated in the semiconductor substrate 104 for controlling the power transistor.

The semiconductor substrate 104 may be relatively thick, e.g. greater than 250 μm thick, or relatively thin, e.g., less than 250 μm thick. The semiconductor substrate 104 may be made of any semiconductor material suitable for manufacturing a power transistor. Examples of such materials include, but are not limited to, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), etc.

The power transistor formed in the semiconductor substrate 104 includes an active area in which one or more power transistor cells are formed. The active area is covered by the metal pad 102 with the dam-like configuration and therefore is out of view in FIG. 1. The metal pad 102 with the dam-like configuration is formed above the semiconductor substrate 104 and covers substantially all of the active area of the power transistor. The metal pad 102 is electrically connected to a source or emitter region in the active area of the power transistor. The metal pad 102 has an interior region 106 laterally surrounded by a peripheral region 108. The peripheral region 108 is thicker than the interior region 106. The thicker peripheral region 108 of the metal pad 102 forms a dam-like structure for retaining material used to attach an interconnect plate or another semiconductor die to the metal pad 102. FIG. 1 does not show an interconnect plate or another semiconductor die attached to the metal pad 102 with the dam-like configuration so as to provide an unobstructed view of the entire metal pad 102.

In one embodiment, the interior region 106 of the metal pad 102 with the dam-like configuration has a thickness t1 in a range of about 5 µm to about 20 µm and the peripheral region 108 of the metal pad 102 has a thickness t2 of about 20 µm or greater. Still other thickness ranges for the interior and peripheral regions 106, 108 of the metal pad 102 are contemplated. In general, the interior and peripheral regions 106, 108 of the metal pad 102 with the dam-like configuration may have any desired thicknesses so long as the peripheral region 108 is thicker than the interior region 106. Such a metal pad 102 with a thinner interior region 106 and a thicker peripheral region 108 is particularly beneficial for thinner semiconductor dies, e.g., in the case of the semiconductor substrate 104 having a thickness of 60 µm or less, because the metal pad 102 exerts less mechanical stress on the semiconductor substrate 104 during heating and cooling of the device 100.

The side of the semiconductor device 100 with the metal pad 102 having the dam-like configuration may include additional metal structures such as other metal pads 110 and/or metal traces 112 formed in the same metal layers as the metal pad 102 with the dam-like configuration. For example, the side of the semiconductor device with the metal pad 102 having the dam-like configuration may also include a gate pad 110 which is electrically connected to gate electrodes in the active area of the power transistor. The gate pad 110 may or may not have the same thickness as the peripheral region 108 of the metal pad 102 with the dam-like configuration. One or more metal traces 112 may be formed at the side of the semiconductor device 100 with the metal pad 102 having the dam-like configuration. The metal traces 112 provide signal routing for the power transistor, and may or may not have the same thickness as the interior region 106 of the metal pad 102 with the dam-like configuration.

Figure 2B:
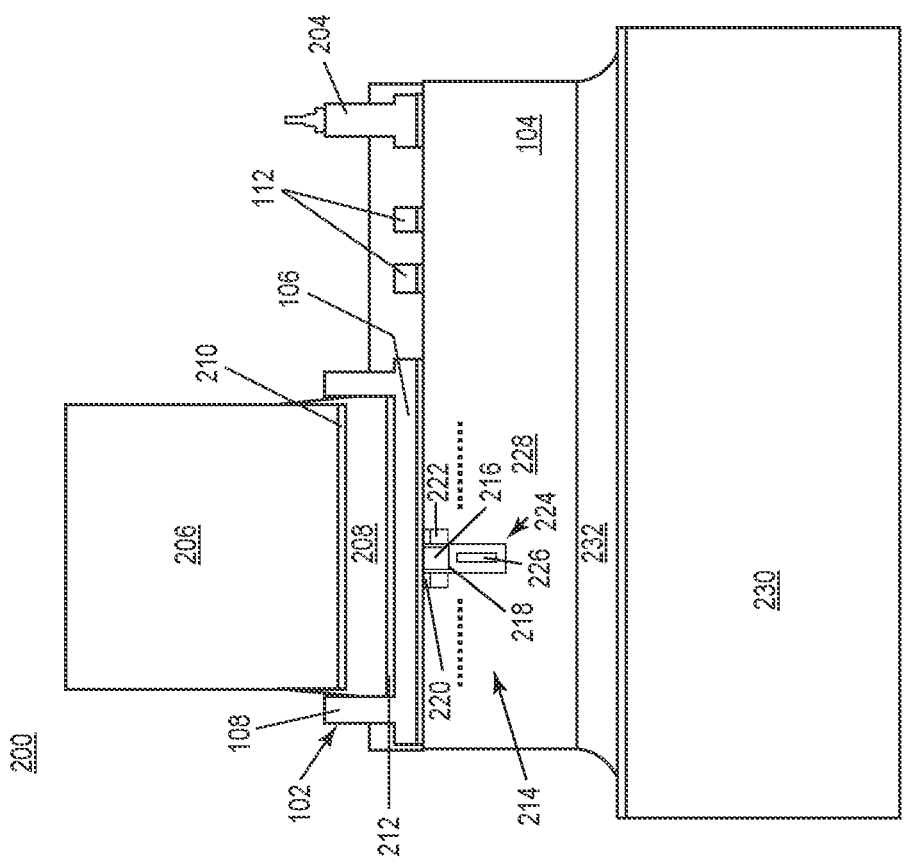
FIG. 2B illustrates a sectional view of the semiconductor device along the line labeled A-A' in FIG. 2A.
Figure 2A:
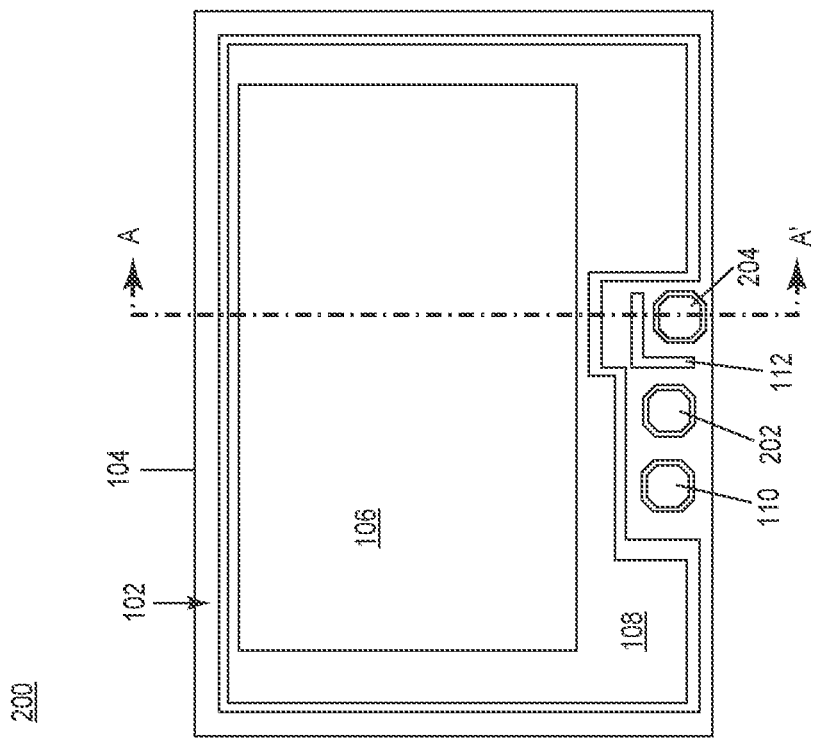
FIG. 2A illustrates a top plan view of another embodiment of a semiconductor device having a metal pad with a dam-like configuration.

FIG. 2A illustrates a top plan view of another embodiment of a semiconductor device 200 having a metal pad 102 with a dam-like configuration, and FIG. 2B illustrates a sectional view of the semiconductor device 200 along the line labeled A-A' in FIG. 2A. The embodiment illustrated in FIGS. 2A and 2B is similar to the embodiment illustrated in FIG. 1. Different, however, the semiconductor device 200 includes additional pads 202, 204 at the side of the semiconductor device 200 with the metal pad 102 having the thinner interior region 106 and the thicker peripheral region 108. The additional pads 202, 204 may be used to electrically contact different or additional regions of the power transistor formed in the semiconductor substrate 104, and/or may be used to bring an electrical contact from the backside of the semiconductor device 200 to the frontside.

FIG. 2B also shows the semiconductor device 200 after an interconnect plate 206 such as a metal clip or metal block is attached to the interior region 106 of the metal pad 102 with a dam-like configuration. The interconnect plate 206 is attached to the interior region 106 of the metal pad 102 by a die attach material 208 such as solder, electrically conductive glue, electrically conductive tape, etc. The interconnect plate 206 and the interior region 106 of the metal pad 102 to which the interconnect plate 206 is attached may each have one or more additional layers 210, 212 such as an adhesion promotion layer.

FIG. 2B also shows the active area 214 of the power transistor formed in the semiconductor substrate 104. The active area 214 includes one or more power transistor cells. Each power transistor cell includes a gate electrode 216 insulated from the semiconductor substrate 216 by a dielectric 218, a source or emitter region 220 of a first conductivity type and a body region 222 of a second conductivity type which provides a channel controlled by a voltage applied to the gat electrode 216. One power transistor cell is shown in FIG. 2B for ease of illustration. Each gate electrode 216 may be disposed in a gate trench 224 formed in the semiconductor substrate 104 and which may or may not include a field electrode 226 below and insulated from the gate electrode 216. According to the embodiment illustrated in FIG. 2B, the power transistor is a vertical device with a drift zone 228 between the body regions 222 and the backside of the semiconductor substrate 104, the backside forming a drain or collector region of the power transistor. A metal body 230 such as a die paddle of a lead frame, metal block, metallized surface of a substrate, etc. is attached to the backside of the semiconductor substrate 104 by a die attach material 232 to form a drain/collector terminal of the semiconductor device 200. The source/emitter terminal is at the opposite side of the device 200, and is formed in part by the metal pad 102 with the thinner interior region 106 and the thicker peripheral region 108 and the interconnect plate 206 attached to the thinner region 106 of the metal pad 102. In one embodiment, the metal pad 102 with the dam-like configuration is a Cu pad and the interconnect plate 207 is a Cu clip. The power transistor may instead have planar gate electrodes insulated from the frontside of the semiconductor substrate 104 and/or may be a lateral device instead of a vertical device.

Figure 2C:
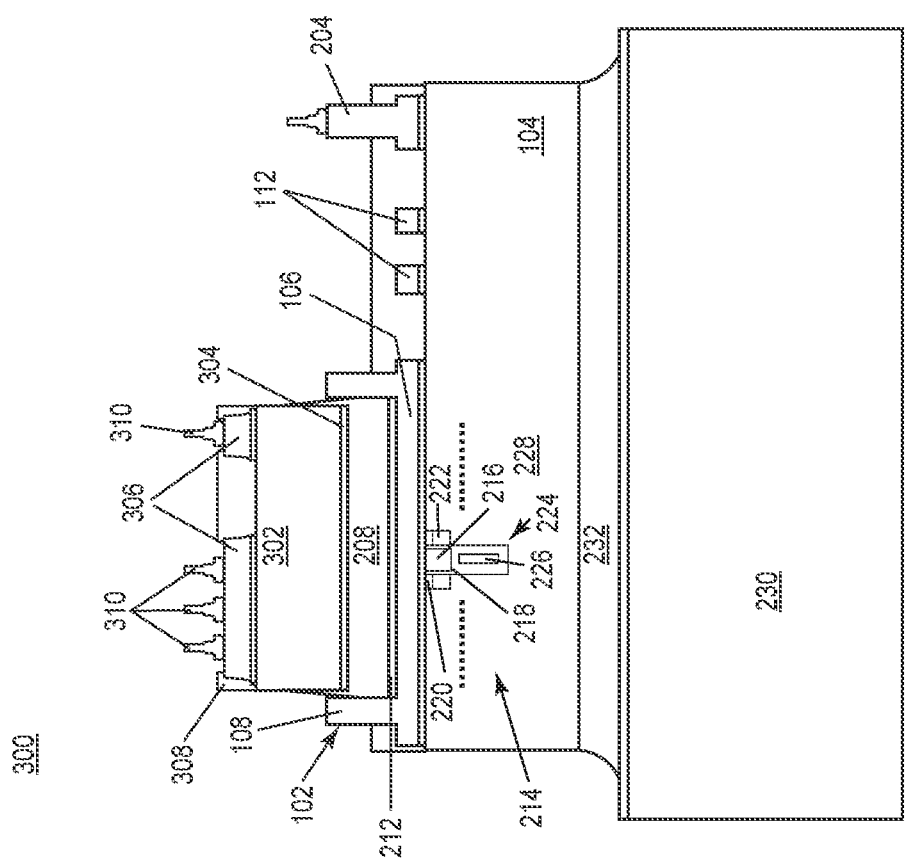
FIG. 2C illustrates a semiconductor device similar to the device shown in FIGS. 2A-2B, but with a semiconductor die attached to the interior region of the metal pad having the dam-like configuration.

FIG. 2C illustrates a semiconductor device 300 similar to the device 200 shown in FIGS. 2A-2B, but with a semiconductor die 302 attached to the interior region 106 of the metal pad 102 having the dam-like configuration instead of an interconnect plate. The semiconductor die 302 may have a metallized surface 304 attached to the interior region 106 of the metal pad 102 by the die attach material 208, and one or more die pads 306 at the opposite side of the semiconductor die 302. A passivation layer 308 may be applied to this side of the semiconductor die 302, and electrical conductors 310 may be attached to the die pads 306 to provide electrical connections to different terminals of the die 302. In one embodiment, the lower die 104 and the upper die 302 are power transistor dies electrically connected in a half bridge configuration via the metal pad 102 with the dam-like configuration.

Figure 3A:
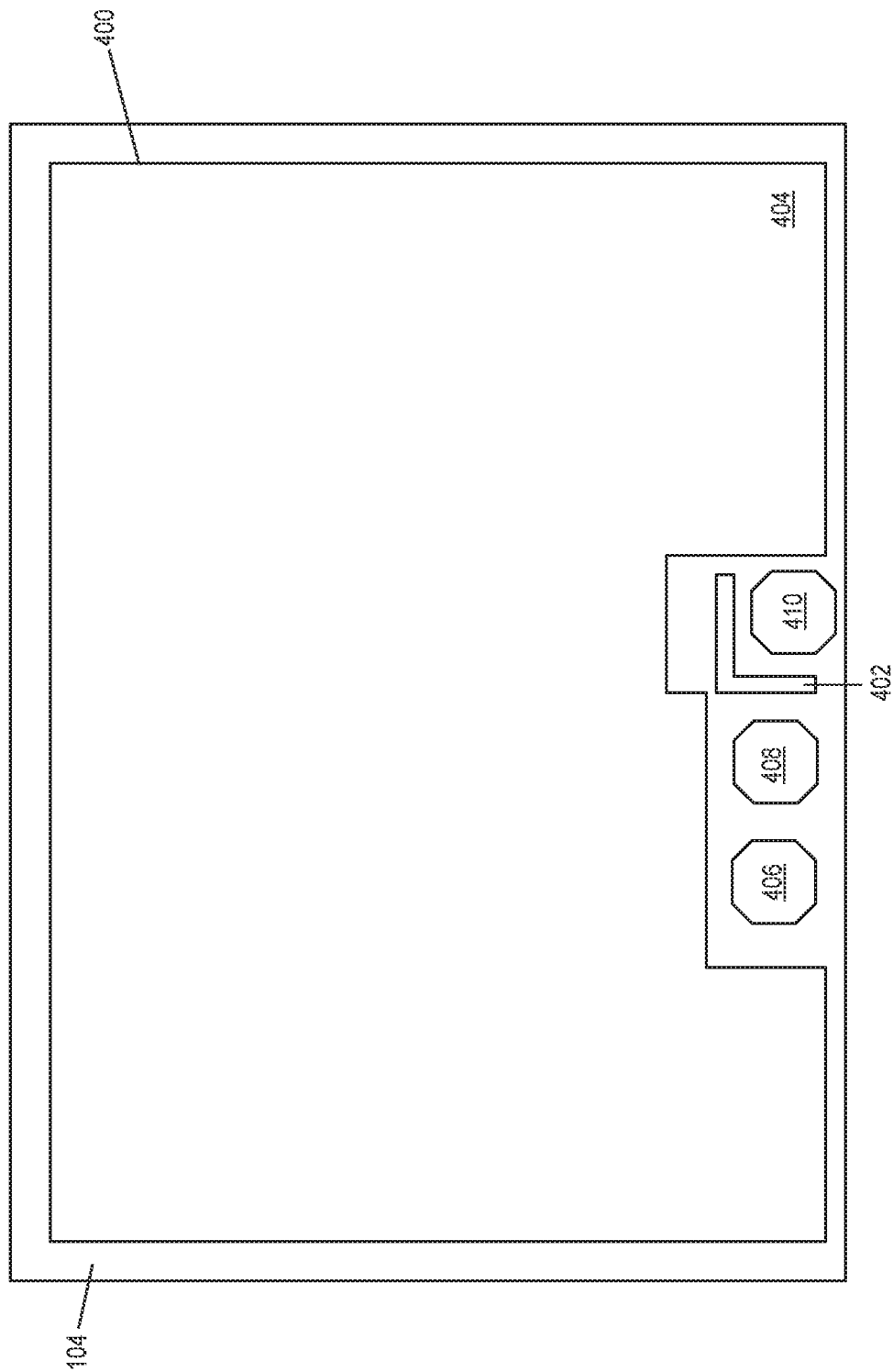
Figure 3B:
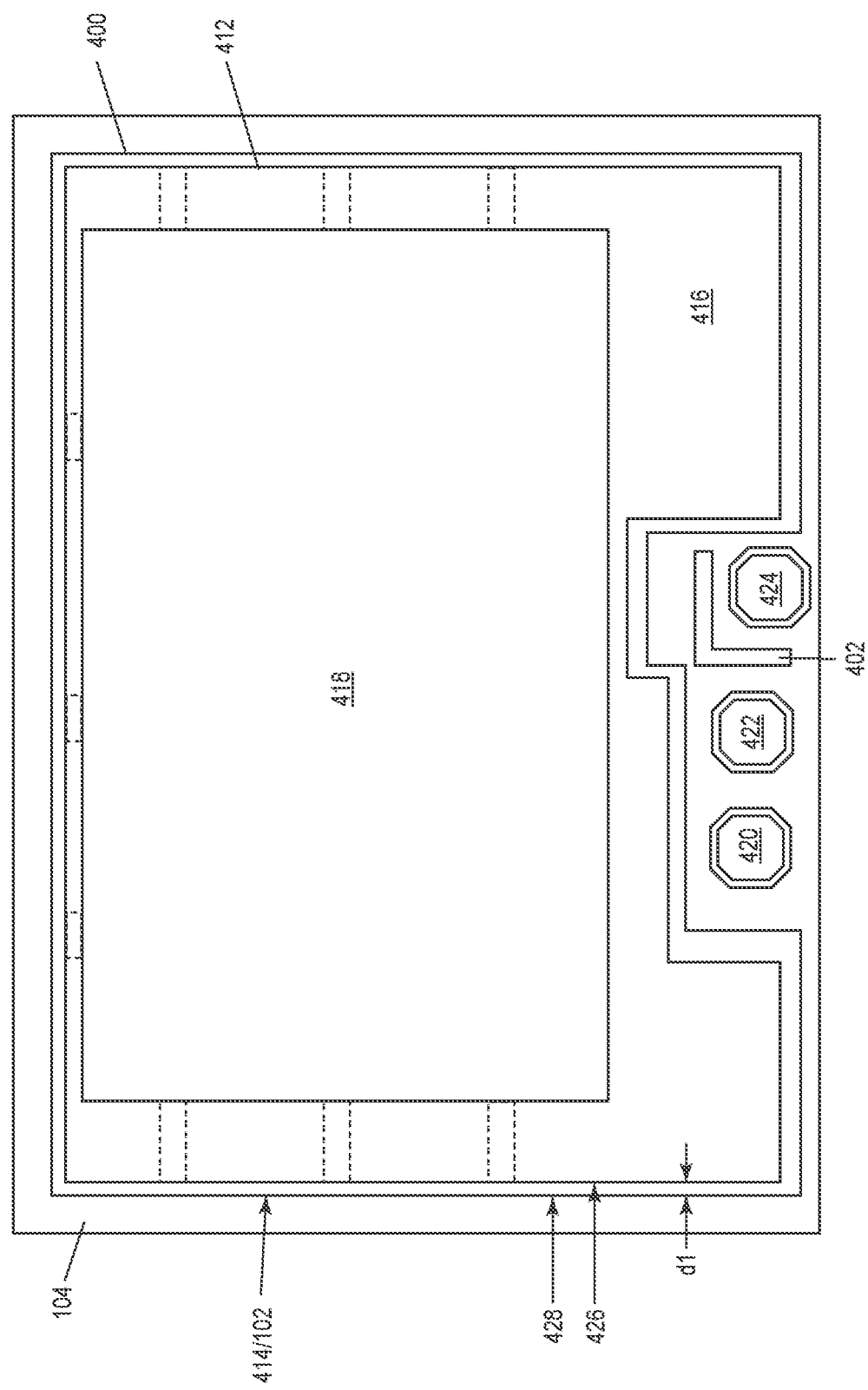

FIGS. 3A through 3C illustrate an embodiment of forming the metal pad 102 with the dam-like configuration shown in FIGS. 2A through 2B, FIG. 3A shows a first patterned metal layer 400 formed over a semiconductor substrate 104. In one embodiment, the first patterned metal layer 400 is a Cu layer formed by electrochemical deposition (ECD). The first patterned metal layer 400 forms metal traces 402 and metal pad bases 404, 406, 408, 410.

FIG. 3B shows a second patterned metal layer 412 formed on the first patterned metal layer 400. In one embodiment, the second patterned metal layer 412 is a Cu layer formed by ECD. The second patterned metal layer 412 is formed where thicker metal is desired. This includes a first metal pad 414/102, where the second patterned metal layer 412 stacked on the first patterned metal layer 400 forms a thicker peripheral region 416 of the first metal pad 414/102. The first metal pad 414/102 also has a thinner interior region 418 which is formed by just the first patterned metal layer 400. The second patterned metal layer 412 may also be used to form other thick metal pads 420, 422, 424. The first and second patterned metal layers 400, 412 may be Cu layers, as explained above, or other types of metal layers such as Al, AlCu, Au, etc. The first and second patterned metal layers 400, 412 may include additional metal layers such as an oxidation prevention layer, adhesion promotion layer, etc. In one embodiment, the exterior lateral edge 426 of the second patterned metal layer 412 is spaced inward from the exterior lateral edge 428 of the first patterned metal layer 400 by a distance d1 along one or more sides of the first metal pad 414/102, e.g., by about 5 µm. The exterior lateral edge 426 of the second patterned metal layer 412 may instead be vertically aligned with the exterior lateral edge 428 of the first patterned metal layer 400 along one or more sides of the first metal pad 414/102.

FIG. 3C shows an interconnect plate 430 attached to the thinner interior region 418 of the first metal pad 414/102. The interconnect plate 430 may be attached to the interior region 418 of the first metal pad 414/102 by a die attach material (out of view) such as solder, electrically conductive glue, electrically conductive tape, etc., as previously described herein. The interior lateral edge 432 of the second patterned metal layer 412 may be spaced apart from the lateral edge 434 of the interconnect plate 430 by a distance d2 along one or more sides of the first metal pad 414/102, e.g., by about 100 µm.

The peripheral region 416 of the first metal pad 414/102 has a dam-like shape, as previously described herein. The dam-like shape may be continuous and uninterrupted over the entire periphery of the first metal pad 414/102 as shown in FIG. 3B. Alternatively, the second patterned metal layer 412 may be structured such that the peripheral region 416 of the first metal pad 414/102 is divided into a plurality of segments with neighboring ones of the segments being laterally separated by a gap. Such gaps are indicted by dashed boxes in FIG. 3B. Accordingly, the dam-like shape of the peripheral region 416 of the first metal pad 414/102 may be continuous and uninterrupted along all sides of the first metal pad 414/102, along some but not all of the sides of the first metal pad 414/102, may have breaks between wall segments, or any other type of desired shape or configuration.

FIG. 4 illustrates a side perspective view of an embodiment of the interconnect plate 430 which is attached to the thinner interior region 416 of the first metal pad 414/102 shown in FIGS. 3A through 3C. According to this embodiment, the interconnect plate 430 is a metal clip such as a Cu clip. The metal clip has a first region 436 extending along a first level L1, a second region 438 extending along a second level L2 above the first level L1 and an intermediary region 440 connecting the first and second regions 436, 438 and providing a transition between the first and second levels L1, L2. The first region 436 of the metal clip 430 is attached to the thinner interior region 418 of the first metal pad 414/102, and the intermediary region 440 of the metal clip 430 provides a height transition so that the metal clip 430 does not contact the peripheral region 416 of the first metal pad 414/102.

Figure 5:
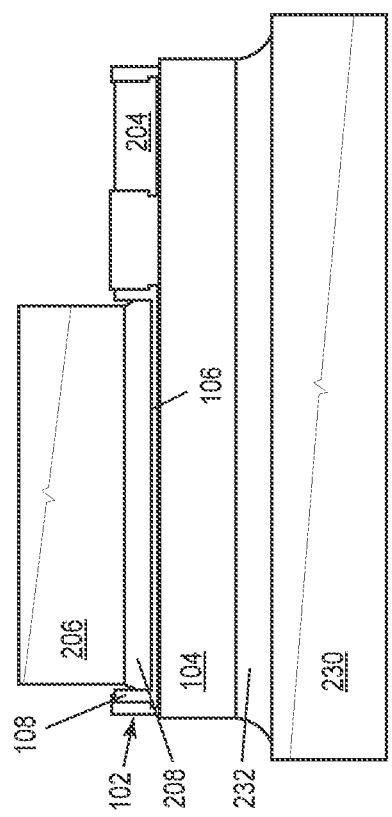
FIGS. 5 through 7 illustrate respective sectional views of further embodiments of semiconductor devices having a metal pad with a dam-like configuration, each having device a different chip pad-to-interconnect interface.
Figure 6:
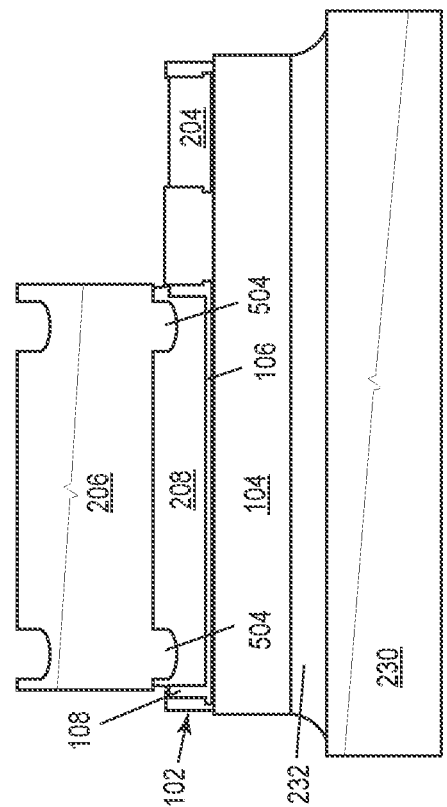
Figure 7:
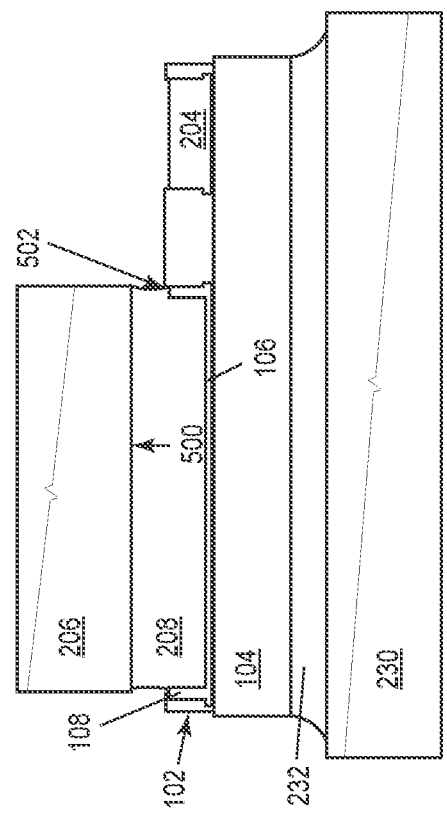

FIGS. 5 through 7 illustrate respective sectional views of further embodiments of semiconductor devices, each having a different chip pad-to-interconnect interface.

In FIG. 5, the peripheral region 108 of the metal pad 102 with the dam-like configuration is thicker than the die attach material 208 used to attach an interconnect plate 206 (or other semiconductor die) to the thinner interior region 106 of the metal pad 102. According to the embodiment, the peripheral region 108 of the metal pad 102 may be used as a guide when placing the first interconnect plate 206 (or other semiconductor die), to ensure the interconnect plate 206 (or other semiconductor die) is properly landed on the thinner interior region 106 of the metal pad 102. For example, after depositing the die attach material 208 on the interior region 106 of the metal pad 102, the interconnect plate 206 (or other semiconductor die) may be placed in contact with the die attach material 208 while using the peripheral region 108 of the metal pad 102 to align the interconnect plate 206 (or other semiconductor die) with the metal pad 102.

In FIG. 6, the die attach material 208 is thicker than the peripheral region 108 of the metal pad 102 with the dam-like configuration so that a bottom surface 500 of the first interconnect plate 206 (or instead the bottom surface of another semiconductor die) is disposed above a top surface 502 of the peripheral region 108 of the metal pad 102. According to this embodiment, the properties of the die attach material 208 allow the interconnect plate 206 (or other semiconductor die) to auto-center on the thinner interior region 106 of the metal pad 102 with the dam-like configuration. For example, after depositing the die attach material 208 on the interior region 206 of the metal pad 102, the interconnect plate 206 (or other semiconductor die) may be placed in contact with the die attach material 208 while using surface tension of the die attach material 208 to align the interconnect plate 206 (or other semiconductor die) with the metal pad 102. The interconnect plate 206 (or other semiconductor die) is soft-landed on the thinner interior region 106 of the metal pad 102, meaning that the interconnect plate 206 (or other semiconductor die) is not pressed into the die attach 208, but instead is gently placed on the die attach material 208. In the case of glue as the die attach material 208, surface tension of the glue centers the interconnect plate 206 (or other semiconductor die). This approach yields a rough alignment of the interconnect plate 206 (or other semiconductor die) with respect to the metal pad 102 having the dam-like configuration.

In FIG. 7, the bottom surface 500 of the interconnect plate 206 has one or more structures 504 laterally disposed inward from the peripheral region 108 of the metal pad 102 with the dam-like configuration and vertically extending toward the interior region 106 of the metal pad 102. The one or more structures 504 may be formed, e.g., by stamping and aid in alignment of the interconnect plate 206 with the interior region 106 of the metal pad 102 during the landing process. For example, after depositing the die attach material 208 on the interior region 106 of the metal pad 102, the interconnect plate 206 may be placed in contact with the die attach material 208 so that the one or more features 504 at the bottom surface 500 of the interconnect plate 206 vertically extend toward the interior region 106 of the metal pad 102 and are laterally disposed inward from the peripheral region 108 of the metal pad 102, to align the interconnect plate 206 with the metal pad 102.

The semiconductor device embodiments illustrated in FIGS. 1, 2A-2B, 3A-3C and 5-7 show one metal pad having a thinner interior region and a thicker peripheral region and one interconnect plate (or other semiconductor die) attached to the thinner interior region of the metal pad. This is done for ease of illustration only. In general, the power transistor included in the semiconductor devices described herein may have one or more output channels or phases for delivering current to a load. In the case of a single output channel, the semiconductor device is a single-phase device. In the case of multiple (more than one) output channels, the semiconductor device is a multi-phase device such as a multi-phase voltage regulator.

The power transistor included in each semiconductor device described herein has an individual active area for each output channel and a separate dam-like metal pad of the kind described herein for each output channel. In general, for a power transistor with N output channels where N is an integer greater than or equal to 1, the corresponding semiconductor device has N separate active areas and N dam-like metal pads of the kind described herein—one for each output channel/active area of the device. One or more interconnect plates may be attached to each of the N dam-like metal pads. That is, the active area of each channel depends on the Ron (on-state resistance) requirement for that channel. As such, different sized interconnect plates may be used, depending on the active area size per channel. For example, a power transistor may have 1 larger active area and 3 smaller active areas. Smaller interconnect plates may be used for the 3 smaller active areas, and 1 larger interconnect plate or multiple smaller interconnect plates may be used for the larger active area.

Figure 8:
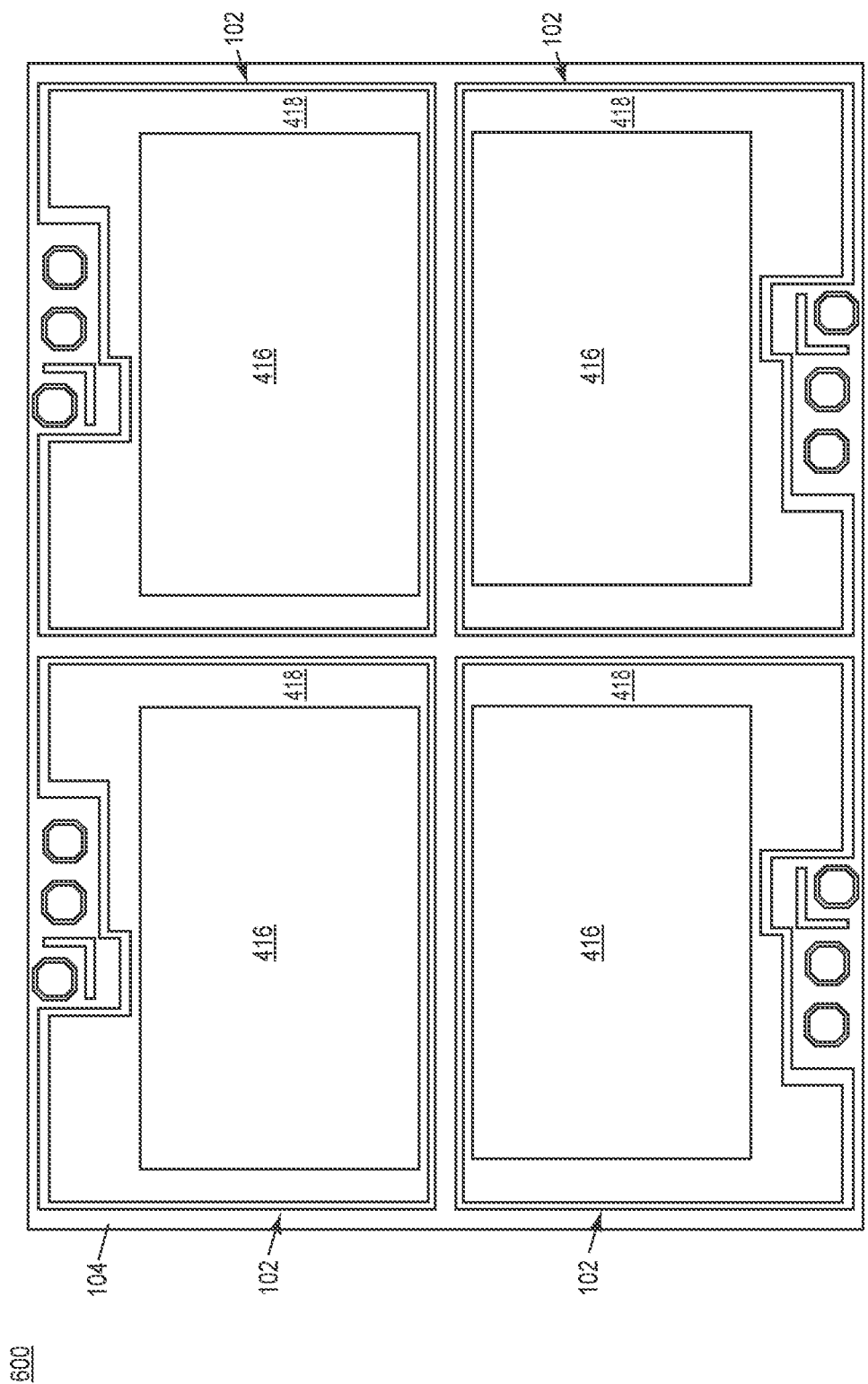
FIG. 8 illustrates a top plan view of an embodiment of a semiconductor device with 4 separate active areas, 4 output channels and a separate metal pad with a dam-like configuration for each active area/output channel.

FIG. 8 illustrates a top plan view of an embodiment of a semiconductor device 600 with 4 separate active areas and hence 4 output channels. Each active area is substantially covered by a separate dam-like metal pad 102 of the kind described herein. Each dam-like metal pad 102 is electrically connected to a source or emitter region in the underlying active area, and has a thinner interior region 106 laterally surrounded by a thicker peripheral region 108. One or more interconnect plates or another semiconductor die is attached to the interior region of 106 each dam-like metal pad 102 by a die attach material. The interconnect plates/additional semiconductor dies are not shown in FIG. 8 so that the details of the dam-like metal pads 102 are unobscured.

FIGS. 9A through 9E illustrate respective sectional views during different stages of manufacturing a semiconductor device having one or more dam-like metal pads of the kind described herein.

FIG. 9A shows a barrier layer 700 such as TiW formed over a semiconductor substrate 702, and a Cu seed layer 704 formed on the barrier layer 700. The barrier layer 700 and the Cu seed layer 704 may be deposited, e.g., by physical vapor deposition (PVD). The barrier layer 700 and the Cu seed layer 704 may be relatively thin, e.g., about 300 nm thick each.

Figure 9B:
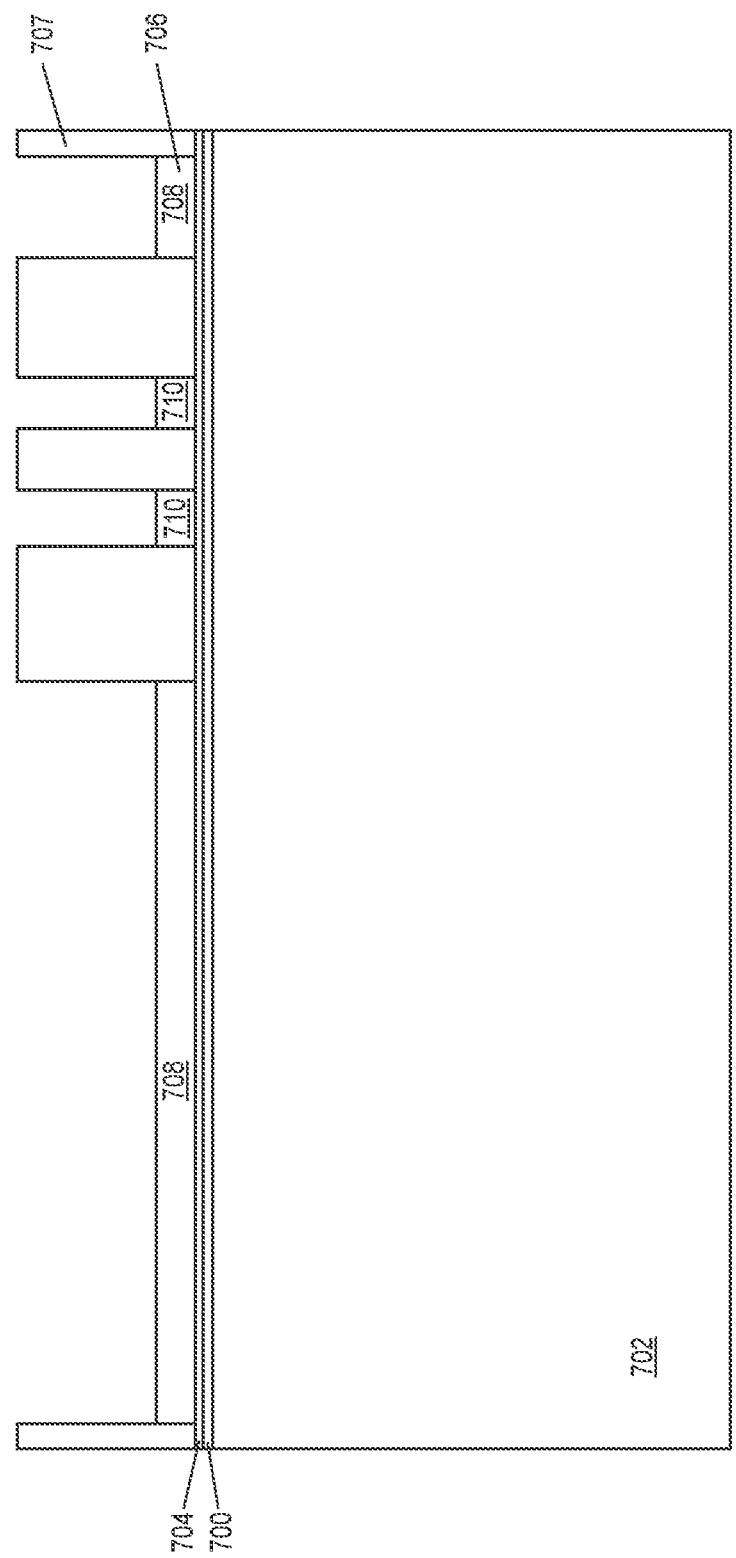

FIG. 9B shows a first Cu layer 706 formed on the Cu seed layer 704. The first Cu layer 706 may be formed by ECD, using a photoresist mask 707 to pattern the deposited Cu into a base 708 for metal pads and into metal traces 710 for signal routing. In one embodiment, the first Cu layer 706 has a thickness in a range of about 5 µm to about 20 µm, e.g., about 5 µm to about 10 µm.

Figure 9C:
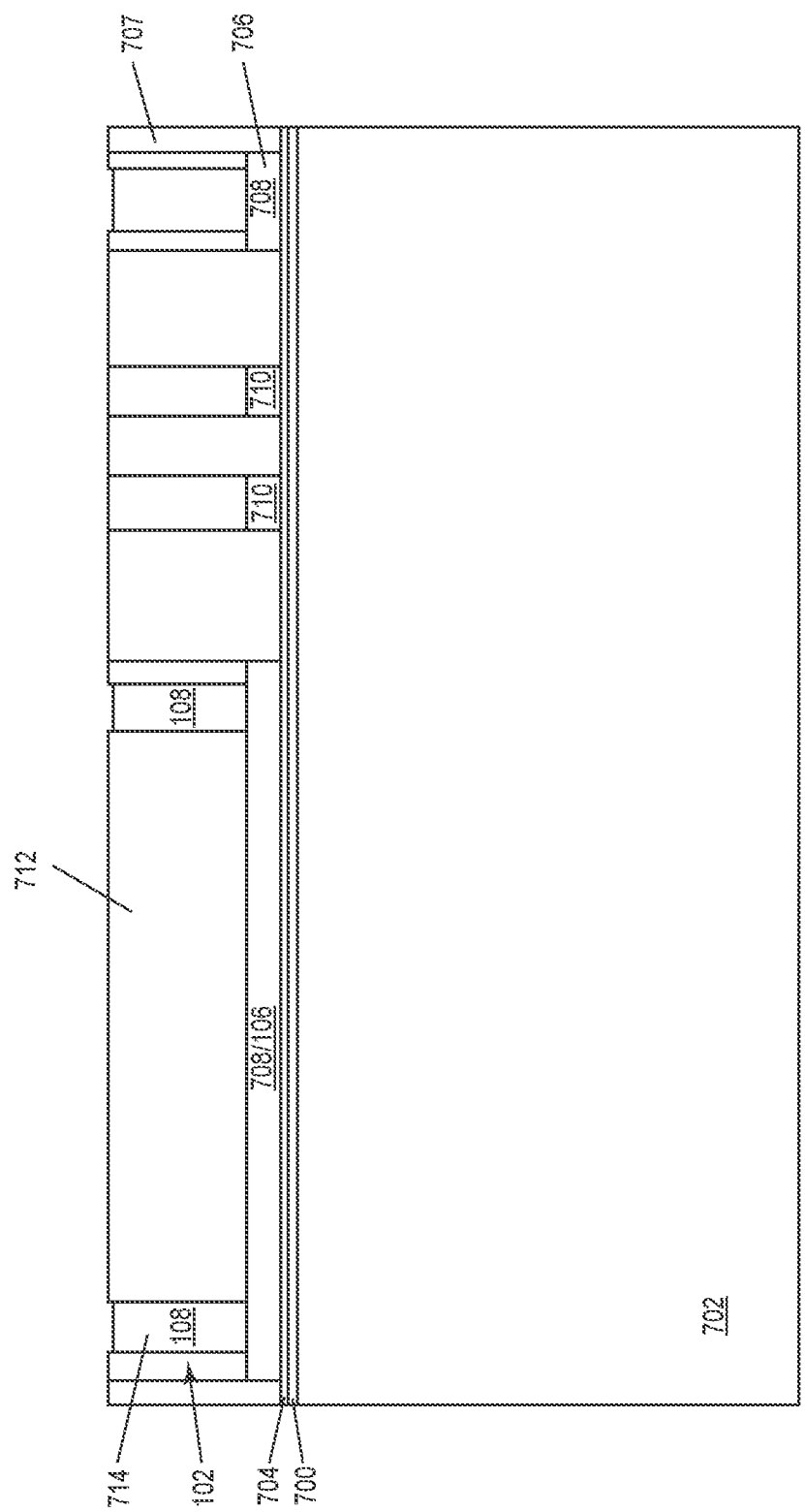

FIG. 9C shows the part of the first Cu layer 706 which corresponds to the interior region/base 708 of the dam-like metal pad and of the metal traces 710 patterned into the first Cu layer 706 being protected by a mask 712, e.g., a resist. The mask 712 prevents subsequent Cu deposition on the first Cu layer 706 in the masked regions. A second Cu layer 714 is then deposited on the part of the first Cu layer 706 which is unprotected by the mask 712 to form the peripheral region 108 of the dam-like metal pad 102 and to thicken other pads, if desired. The interior region 106 of the dam-like metal pad 102 is formed by the part of the first Cu layer 706 protected by the mask 712 during deposition of the second Cu layer 714. The same mask may be used to form both Cu layers 706, 714, wherein parts of the mask are removed after deposition of the first Cu layer 706 to form the second Cu layer 714 in the desired areas. In one embodiment, the second Cu layer 714 has a thickness in a range of about 10 µm to about 20 µm, e.g., about 10 µm to about 15 µm.

Figure 9D:
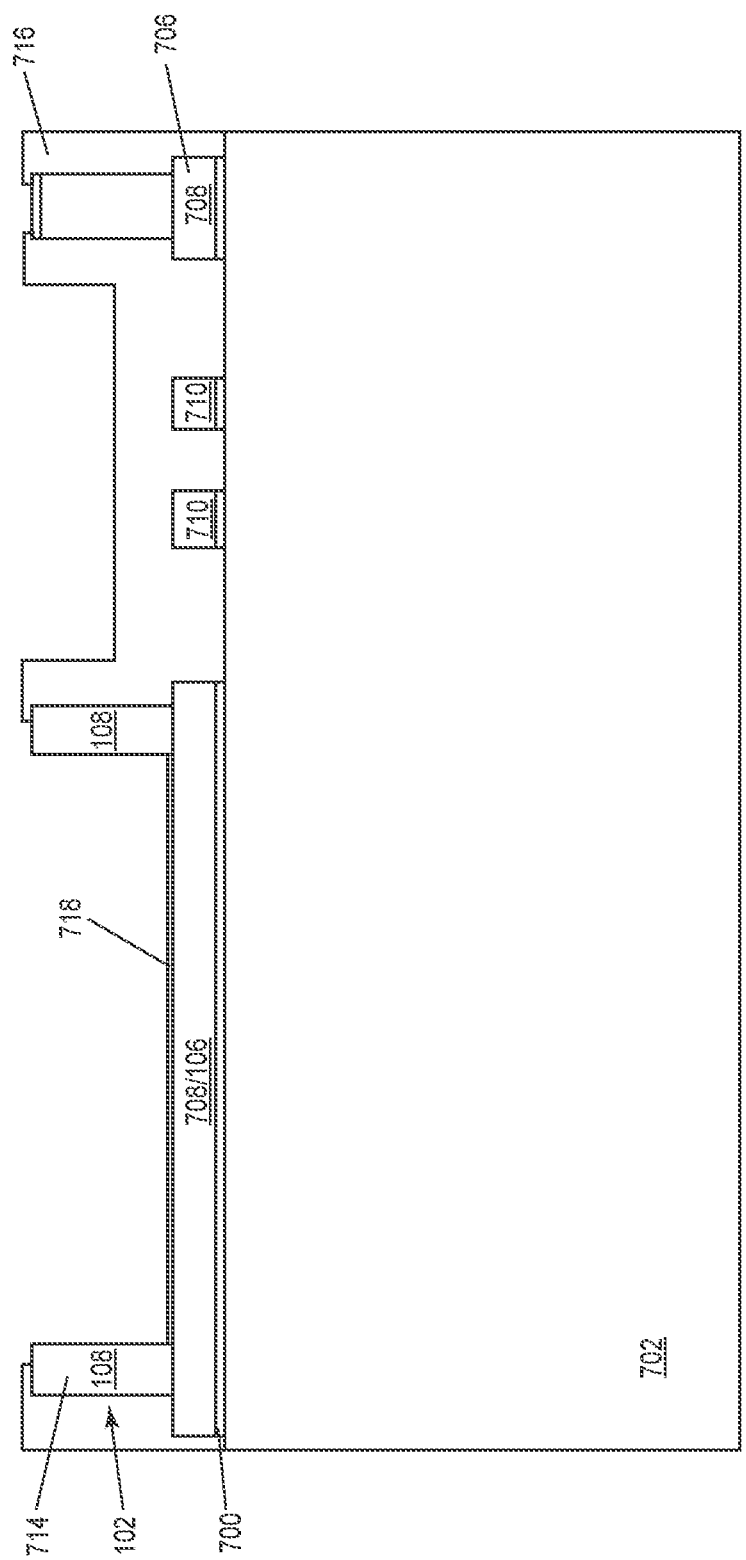

FIG. 9D shows the structure after the mask 707/712 used for Cu deposition is removed, after a new ask 716 such as an imide mask is formed which covers the metal traces 710 and part of the periphery of the metal pads 708/106, and after a protective layer 718 such as a passivation is formed on the exposed part of the second Cu layer 714. The exposed part of the second Cu layer 714 is protected by the protective layer 718, in case Ag etching is employed.

Figure 9E:
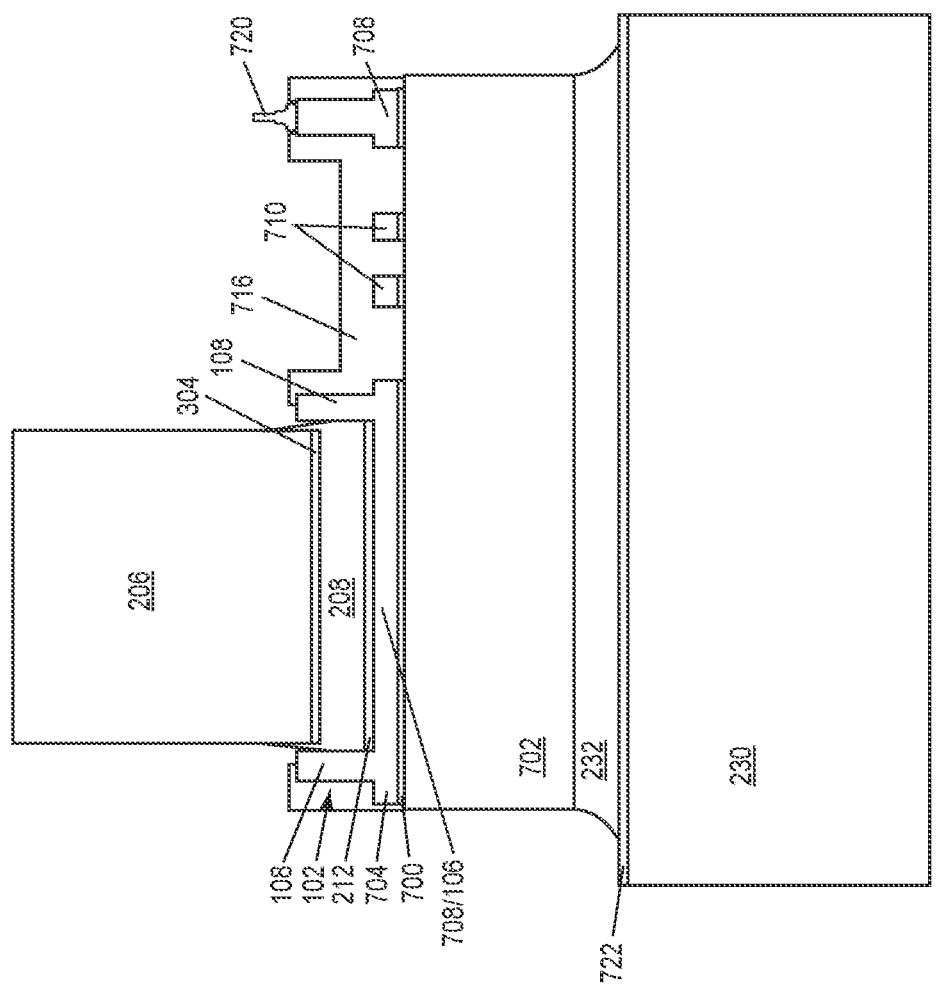

FIG. 9E shows the structure after an interconnect plate 206 such as a metal clip or metal block, or another semiconductor die is attached to the thinner interior region 708/106 of the dam-like metal pad 102, after a conductor 720 such as a wire stud bump, pillar, vertical (cut) bond wire, etc. is attached to other ones of the bond pads 708 which do not have a dam-like configuration, and after a metal body 230 such as a die paddle of a leadframe, metal block, metallized surface of a substrate, etc. is attached to the backside of the semiconductor substrate 104. Die attach materials 208, 232 such as solder, electrically conductive glue, electrically conductive tape, etc. may be used to facilitate some or all of the attachments. Additional layers 212, 304, 722 such as an adhesion promotion layer may be used in conjunction with the die attach materials 208, 232.

Figure 10B:
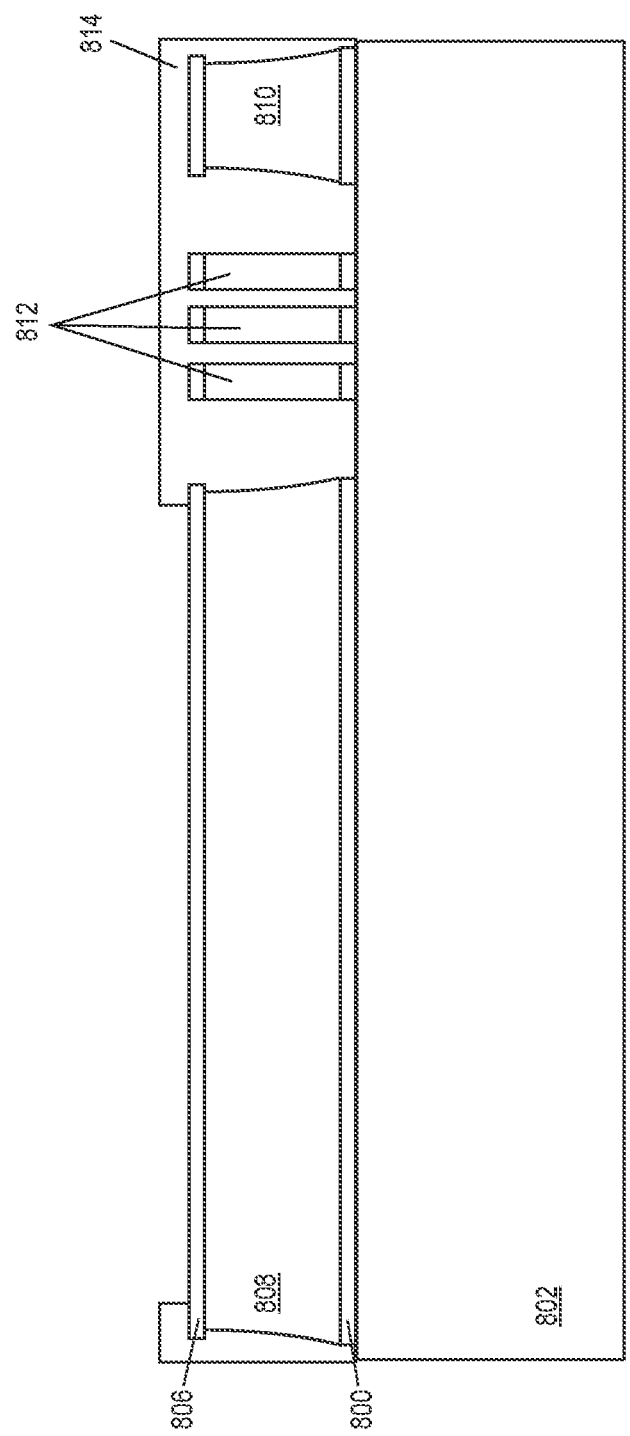
Figure 10C:
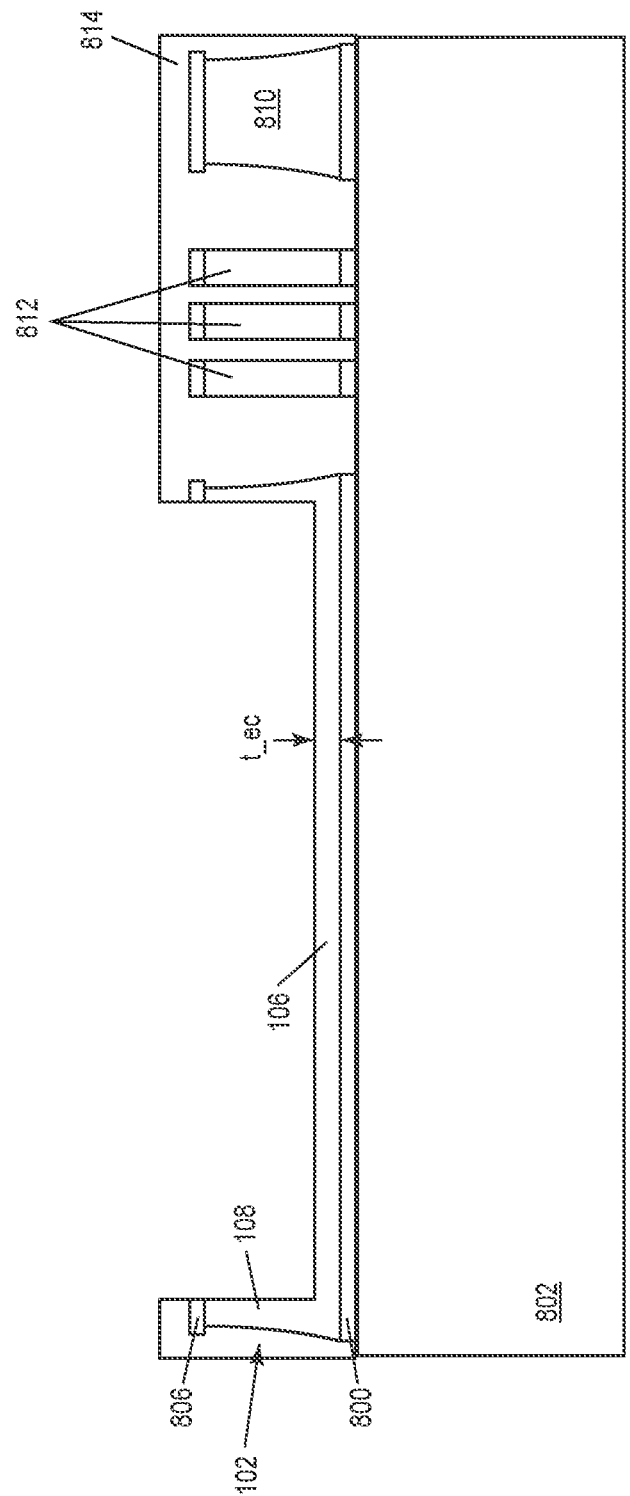

FIGS. 10A through 10C illustrate respective sectional views during different stages of manufacturing a semiconductor device having one or more dam-like metal pads of the kind described herein, according to another embodiment.

FIG. 10A shows a barrier layer 800 such as TiW formed over a semiconductor substrate 802, a Cu layer 804 formed on the barrier layer 800, and an optional silver or aluminium layer 806 formed on the Cu layer 804. In one embodiment, the barrier layer 800 is relatively thin, e.g., about 300 nm thick, and the Cu layer 804 is relatively thick, e.g., at least 10 µm or at least 20 µm thick. In the case of a silver or aluminium layer 806 deposited on the Cu layer 804, the optional layer 806 is thinner than the Cu layer 804, e.g., about 200 nm in the case of Ag or about 50 nm in the case of Al.

FIG. 10B shows the Cu layer 804 patterned, e.g. by lithography and etching, to form metal pad and metal trace structures 808, 810, 812 in the Cu layer 804. The patterning process may include Ag or Al etching, e.g., using diluted hydrofluoric acid, followed by Cu etching, e.g. using $H_3PO_4$ or $H_2O_2$, followed by TiW etching, e.g., using $H_2O_2$. After the Cu layer patterning process, a mask 814 such as an imide mask is formed which covers the metal trace structures 812, the metal pad structures 810 which are to have a uniform thickness, and the periphery of the dam-like metal pad structure 808. The exposed part of the Cu layer 804 unprotected by the mask 814 is then etched, e.g. using $H_3PO_4$ or $H_2O_2$, to form a metal pad 102 having a dam-like configuration with a thinner interior region 106 and a thicker peripheral region 108. The thickness t_ec of the etched part of the Cu layer 804 may be in a range of 5 µm to 10 µm. The peripheral region 108 of the dam-like metal pad 102 is formed by the part of the Cu layer 804 protected by the mask 814 during the etching of the Cu layer 804. An interconnect plate such as a metal clip or metal block, or another semiconductor die may then be attached to the thinner interior region 106 of the dam-like metal pad 102, as previously described herein.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor substrate;
a power transistor formed in the semiconductor substrate, the power transistor including an active area in which one or more power transistor cells are formed;
a first metal pad formed above the semiconductor substrate and covering substantially all of the active area of the power transistor, the first metal pad being electrically connected to a source or emitter region in the active area of the power transistor, the first metal pad comprising an interior region laterally surrounded by a peripheral region, the peripheral region being thicker than the interior region; and
a first interconnect plate or a semiconductor die attached to the interior region of the first metal pad by a die attach material at a side of the interior region facing away from the semiconductor substrate.

2. The semiconductor device of claim 1, wherein the interior region of the first metal pad has a thickness in a range of 5 µm to 10 µm, wherein the peripheral region of the first metal pad has a thickness of about 20 µm or greater.

3. The semiconductor device of claim 2, wherein the semiconductor substrate has a thickness of 60 µm or less.

4. The semiconductor device of claim 1, wherein the peripheral region of the first metal pad is thicker than the die attach material.

5. The semiconductor device of claim 1, wherein the die attach material is thicker than the peripheral region of the first metal pad so that a bottom surface of the first interconnect plate or the semiconductor die is disposed above a top surface of the peripheral region of the first metal pad.

6. The semiconductor device of claim 1, wherein a bottom surface of the first interconnect plate has one or more structures laterally disposed inward from the peripheral region of the first metal pad and vertically extending toward the interior region of the first metal pad.

7. The semiconductor device of claim 1, wherein the peripheral region of the first metal pad is divided into a plurality of segments, and wherein neighboring ones of the segments are laterally separated by a gap.

8. The semiconductor device of claim 1, wherein the power transistor comprises a plurality of output channels, each output channel configured to deliver current to a load, wherein the power transistor comprises an individual active area for each output channel, and wherein the first metal pad covers substantially a first one of the active areas of the power transistor.

9. The semiconductor device of claim 8, further comprising:
a plurality of additional metal pads formed above the semiconductor substrate, each additional metal pad covering substantially a corresponding one of the active areas of the power transistor, each additional metal pad being electrically connected to a source or emitter region in the active area substantially covered by the metal pad, each metal pad comprising an interior region laterally surrounded by a peripheral region, the peripheral region being thicker than the interior region; and
a plurality of additional interconnect plates, each additional interconnect plate being attached to the interior region of a corresponding one of the additional metal pads by a die attach material at a side of the interior region facing away from the semiconductor substrate.

10. The semiconductor device of claim 1, further comprising one or more logic devices integrated in a different region of the semiconductor substrate as the power transistor.

11. The semiconductor device of claim 1, wherein the first metal pad is a Cu pad, and wherein the first interconnect plate is a Cu clip.

12. A method of manufacturing a semiconductor device, the method comprising:
forming a power transistor in a semiconductor substrate, the power transistor including an active area in which one or more power transistor cells are formed;
forming a first metal pad above the semiconductor substrate and which covers substantially all of the active area of the power transistor, the first metal pad being electrically connected to a source or emitter region in the active area of the power transistor, the first metal pad comprising an interior region laterally surrounded by a peripheral region, the peripheral region being thicker than the interior region; and
attaching a first interconnect plate or a semiconductor die to the interior region of the first metal pad by a die attach material at a side of the interior region facing away from the semiconductor substrate.

13. The method of claim 12, wherein forming the first metal pad comprises:
depositing a first Cu layer above the semiconductor substrate and which covers substantially all of the active area of the power transistor;
forming a mask on a part of the first Cu layer which corresponds to the interior region of the first metal pad, the mask configured to prevent Cu deposition; and depositing a second Cu layer on a part of the first Cu layer unprotected by the mask to form the peripheral region of the first metal pad, the interior region of the first metal pad being formed by the part of the first Cu layer protected by the mask during the depositing of the second Cu layer.

14. The method of claim 13, wherein the first Cu layer has a thickness in a range of 5 µm to 10 µm, and wherein the second Cu layer has a thickness in a range of 10 µm to 20 µm.

15. The method of claim 12, wherein forming the first metal pad comprises:
depositing a Cu layer above the semiconductor substrate and which covers substantially all of the active area of the power transistor;
forming a mask on a part of the Cu layer which corresponds to the peripheral region of the first metal pad, the mask configured to prevent Cu etching; and
etching a part of the Cu layer unprotected by the mask to form the interior region of the first metal pad, the peripheral region of the first metal pad being formed by the part of the Cu layer protected by the mask during the etching of the Cu layer.

16. The method of claim 15, wherein the thickness of the Cu layer as deposited is about 20 µm or more, and wherein the thickness of the etched part of the Cu layer is in a range of 5 µm to 10 µm.

17. The method of claim 12, wherein the peripheral region of the first metal pad is thicker than the die attach material, and wherein attaching the first interconnect plate or the semiconductor die to the interior region of the first metal pad comprises:
depositing the die attach material on the interior region of the first metal pad; and
placing the first interconnect plate in contact with the die attach material while using the peripheral region of the first metal pad to align the first interconnect plate with the first metal pad.

18. The method of claim 12, wherein the die attach material is thicker than the peripheral region of the first metal pad, and wherein attaching the first interconnect plate or the semiconductor die to the interior region of the first metal pad comprises:
depositing the die attach material on the interior region of the first metal pad; and
placing the first interconnect plate in contact with the die attach material while using surface tension of the die attach material to align the first interconnect plate with the first metal pad.

19. The method of claim 12, wherein a bottom surface of the first interconnect plate has one or more structures laterally disposed inward from the peripheral region of the first metal pad, and wherein attaching the first interconnect plate or the semiconductor die to the interior region of the first metal pad comprises:
depositing the die attach material on the interior region of the first metal pad; and
placing the first interconnect plate in contact with the die attach material so that the one or more features at the bottom surface of the first interconnect plate vertically extend toward the interior region of the first metal pad and are laterally disposed inward from the peripheral region of the first metal pad, to align the first interconnect plate with the first metal pad.

20. The method of claim 12, wherein the power transistor comprises a plurality of output channels, each output channel configured to deliver current to a load, wherein the power transistor comprises an individual active area for each output channel, and wherein the first metal pad covers substantially a first one of the active areas of the power transistor, the method further comprising:
forming a plurality of additional metal pads above the semiconductor substrate, each additional metal pad covering substantially a corresponding one of the active areas of the power transistor, each additional metal pad being electrically connected to a source or emitter region in the active area substantially covered by the Metal pad, each Metal pad comprising an interior region laterally surrounded by a peripheral region, the peripheral region being thicker than the interior region; and
attaching each of a plurality of additional interconnect plates to the interior region of a corresponding one of the additional metal pads by a die attach material at a side of the interior region facing away from the semiconductor substrate.

* * * * *